United States Patent
Fukuda et al.

(10) Patent No.: US 8,795,822 B2
(45) Date of Patent: *Aug. 5, 2014

(54) METAL FLUORIDE EUTECTIC AND NEUTRON SCINTILLATOR

(75) Inventors: Kentaro Fukuda, Shunan (JP); Noriaki Kawaguchi, Shunan (JP); Akira Yoshikawa, Sendai (JP); Takayuki Yanagida, Sendai (JP); Yui Yokota, Sendai (JP); Yutaka Fujimoto, Sendai (JP)

(73) Assignees: Tokuyama Corporation, Shunan-shi (JP); Tohoku University, Sendai-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/823,597

(22) PCT Filed: Nov. 1, 2011

(86) PCT No.: PCT/JP2011/075226
§ 371 (c)(1),
(2), (4) Date: Mar. 14, 2013

(87) PCT Pub. No.: WO2012/060394
PCT Pub. Date: May 10, 2012

(65) Prior Publication Data
US 2013/0183509 A1 Jul. 18, 2013

(30) Foreign Application Priority Data
Nov. 2, 2010 (JP) ................. 2010-245895

(51) Int. Cl.
*B32B 7/02* (2006.01)
*C09K 11/08* (2006.01)
*C09K 11/77* (2006.01)
*G01T 3/06* (2006.01)
*C30B 21/00* (2006.01)
*C01F 11/22* (2006.01)
*C30B 29/12* (2006.01)
*C09K 11/61* (2006.01)
*C01D 15/04* (2006.01)

(52) U.S. Cl.
CPC ............. *C09K 11/772* (2013.01); *G01T 3/06* (2013.01); *C30B 21/00* (2013.01); *C01F 11/22* (2013.01); *C30B 29/12* (2013.01); *C09K 11/616* (2013.01); *C01D 15/04* (2013.01)
USPC ................................ 428/216; 252/301.33

(58) Field of Classification Search
None
See application file for complete search history.

(56) References Cited

U.S. PATENT DOCUMENTS
5,268,301 A 12/1993 Potter

FOREIGN PATENT DOCUMENTS
EP 2 219 048 A2 8/2010
EP 2 256 177 A1 12/2010
(Continued)

OTHER PUBLICATIONS
Yanagida et al., "Crystal growth, optical properties, and alpha-ray responses of Ce-doped LiCaAlF6 for different Ce concentration," Optical Materials, vol. 32, Issue 2, Dec. 2009.*

(Continued)

*Primary Examiner* — David Sample
*Assistant Examiner* — Nicole T Gugliotta
(74) *Attorney, Agent, or Firm* — Birch, Stewart, Kolasch & Birch, LLP

(57) ABSTRACT

[Problems to be Solved] A neutron scintillator excellent in neutron detection efficiency and n/γ discrimination ability, and a metal fluoride eutectic preferred for the neutron scintillator are provided.
[Means to Solve the Problems] A metal fluoride eutectic having a cerium-containing calcium fluoride crystal phase and a lithium fluoride crystal phase present in a phase-separated state, and a neutron scintillator comprising the metal fluoride eutectic.

5 Claims, 6 Drawing Sheets

(56) References Cited

FOREIGN PATENT DOCUMENTS

| | | | |
|---|---|---|---|
| GB | 586194 | A | 3/1947 |
| WO | WO 2004/072680 | A2 | 8/2004 |
| WO | WO 2009/119378 | A1 | 10/2009 |

OTHER PUBLICATIONS

International Search Report for PCT/JP2011/075226 mailed on Jan. 31, 2012.

Rhodes et al., "Pixelated neutron scintillation detectors using fibre optic coded arrays", Nuclear Instruments and Methods in Physics Research, A392, 1997, pp. 315-318.

Trojan-Piegza et al., "CaF2 (Eu2+) : LiF—Structural and spectroscopic properties of a new system for neutron detection", Radiation Measurements, 2010, pp. 1-5.

Watanabe et al., "Ce: LiCaAlF6 Scintillator ni Okeru Chuseishi-ysen Hakei Benbetsuho", ("Pulse Shape Discrimination for Neutron-Gamma Discrimination in a Ce: LiCaAlF6 Scintillator"), Extended abstracts; The Japan Society of Applied Physics, Aug. 30, 2010, vol. 71, Ronbun No. 16P-L-12.

Yokota et al., "Optical properties and radiation responses for Ce, Na co-doped", LiCaAlF6 scintillator crystals, Dai 20 Kai Association for Condensed Matter Photophysics Ronbunshu, 2009.12, vol. 20, pp. 41-44.

Extended European Search Report for European Application No. 11838044.3 dated Feb. 5, 2014.

Gibilaro et al., "Co-reduction of aluminium and lanthanide ions in molten fluorides: Application to cerium and samarium extraction from nuclear wastes," Electrochimica Acta vol. 54, No. 22, Sep. 1, 2009, pp. 5300-5306, XP026252526.

\* cited by examiner

METAL FLUORIDE EUTECTIC AND NEUTRON SCINTILLATOR

TECHNICAL FIELD

This invention relates to a metal fluoride eutectic and a neutron scintillator comprising the metal fluoride eutectic. More specifically, the invention relates to a metal fluoride eutectic consisting substantially of a lithium fluoride crystal phase and a calcium fluoride crystal phase containing cerium.

BACKGROUND ART

Neutron detectors are a component technology supporting neutron beam application technologies. With the progress of neutron beam application technologies in academic research fields such as neutron diffraction, in nondestructive inspection fields, or in security fields such as cargo inspection, neutron detectors with higher performance are desired.

Main performances demanded of the neutron detector are a detection efficiency for neutrons and the count rate of neutrons, and the ability to discriminate between neutrons and gamma rays (may hereinafter be referred to as n/γ discrimination ability). The detection efficiency means the ratio of the number of radiations counted by the detector to the number of radiations emitted from a radiation source and entered into the detector. The count rate means the number of radiations counted per unit time. Gamma rays are generated when neutrons hit an element contained in a constituent member of a detection system for detecting neutrons, or in an object to be tested, such as Fe (iron), Pb (lead), Cd (cadmium), C (carbon) or N (nitrogen). If the discrimination ability for neutron beams versus gamma rays is low, a false signal due to gamma ray which does not reflect the interaction between neutrons and the object to be tested contaminate the true neutron signals, and a so-called background noise increases.

Neutrons have a high power to pass through a substance without doing any interaction in the substance. Therefore, a nuclear reaction for promptly converting neutrons into charged particles having energy is generally utilized to detect the neutron beam. For example, a helium-3 ($^3$He) detector which detects neutrons by unitization of protons and tritons generated by a nuclear reaction between $^3$He and neutrons has so far been known. This detector has high detection efficiency and excellent n/γ discrimination ability, but has posed the problem of a limited count rate. Moreover, $^3$He is an expensive substance and its resources are limited.

Recently, the development of a detector using a neutron scintillator, instead of the above-mentioned $^3$He gas process, has been underway in an attempt to produce an inexpensive and upsized detector. The neutron scintillator refers to a substance which, when hit by neutrons, absorbs the neutrons to emit fluorescence. The aforementioned various performances of a neutron detector using this scintillator depend on a substance constituting the scintillator. For example, if an isotope, such as $^6$Li, which captures neutrons with high efficiency is contained in a large amount in the substance constituting the scintillator, the detection efficiency increases. If the scintillator is composed of a light element which minimally interacts with gamma rays, on the other hand, the background noise due to the gamma rays is reduced. The decay time of fluorescence influences the count rate.

LiF/ZnS has been used as a neutron scintillator having a relatively high neutron detection efficiency and excellent n/γ discrimination ability (see Non-Patent Document 1). Since the LiF/ZnS is opaque, however, an increase in the thickness of the scintillator has made it impossible to take out scintillation light efficiently. Thus, the LiF/ZnS has been limited in the improvement of neutron detection efficiency.

In view of such problems, a proposal has been made for a neutron scintillator comprising a eutectic composed of europium-containing calcium fluoride crystals and lithium fluoride crystals (see Non-Patent Document 2). This neutron scintillator composed of the eutectic is translucent, and enables scintillation light to be collected with high efficiency. Thus, this neutron scintillator can achieve a very high neutron detection efficiency. According to studies by the inventors of the present invention, however, the eutectic has been poor in n/γ discrimination ability, and still has left room for improvement.

PRIOR ART DOCUMENTS

Non-Patent Documents

Non-Patent Document 1: N. J. Rhodes, et al., "Pixelated neutron scintillation detectors using fibre optic coded arrays", Nuclear Instruments and Methods in Physics Research, A392, 315-318 (1997).

Non-Patent Document 2: J. Trojan-Piegza, et al., "$CaF_2$ ($Eu^{2+}$):LiF—Structural and spectroscopic properties of a new system for neutron detection", Radiation Measurements, 45, 163-167 (2010).

SUMMARY OF THE INVENTION

Problems to be Solved by the Invention

It is an object of the present invention to provide a neutron scintillator excellent in neutron detection efficiency and n/γ discrimination ability, and a eutectic substance preferred for the neutron scintillator.

Means for Solving the Problems

The present inventors have conducted various studies on metal fluoride eutectics composed of lithium fluoride crystals and calcium fluoride crystals. As a result, they have found that a neutron scintillator having excellent n/γ discrimination ability is obtained by incorporating cerium into calcium fluoride crystals constituting the metal fluoride eutectic. This finding has led them to accomplish the present invention.

That is, according to the present invention, there is provided a metal fluoride eutectic consisting substantially of a lithium fluoride crystal phase and a calcium fluoride crystal phase containing cerium.

In the metal fluoride eutectic, it is preferred that 1) the lithium fluoride crystal phase be of a layered structure having layers each 0.1 μm to 5 μm thick;

2) the content of cerium be 0.05 to 10 mol % based on calcium fluoride; and 3) the calcium fluoride crystal phase be linearly continuous in one direction.

According to the present invention, there is also provided a neutron scintillator comprising the metal fluoride eutectic.

Effects of the Invention

The present invention provides a neutron scintillator having high neutron detection efficiency and excellent n/γ discrimination ability, and a metal fluoride eutectic preferred for the neutron scintillator. A neutron detector using such a neutron scintillator can be preferably used in scientific research

MODE FOR CARRYING OUT THE INVENTION

Figure 1:
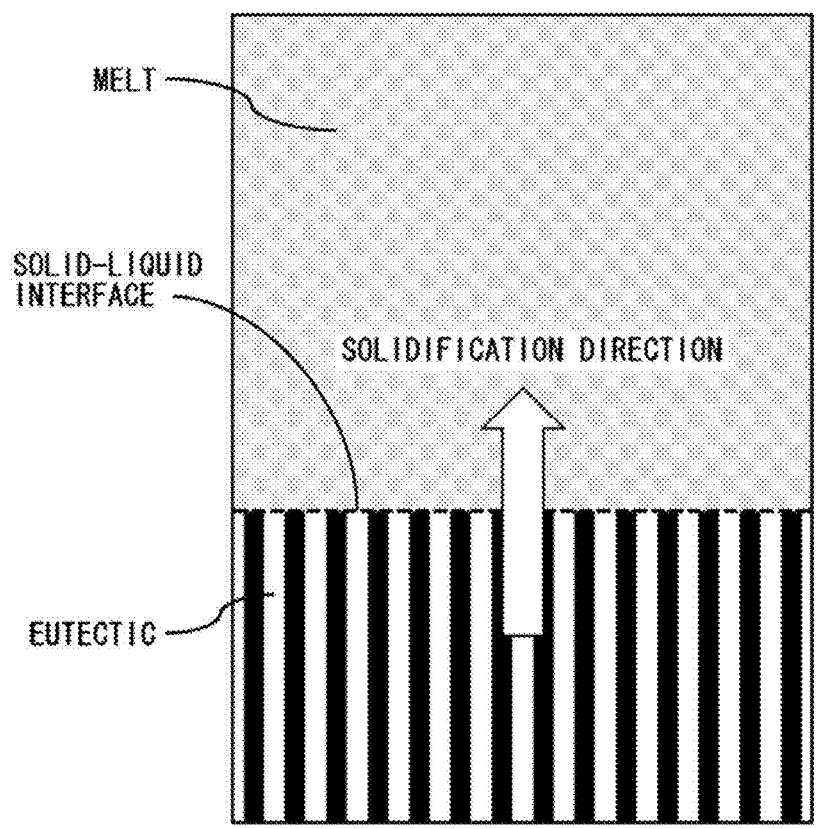
FIG. 1 is a schematic view of the unidirectional solidification process.

The metal fluoride eutectic of the present invention is a metal fluoride eutectic consisting substantially of two crystal phases, i.e., lithium fluoride (may hereinafter be referred to as LiF) crystals and cerium-containing calcium fluoride (may hereinafter be referred to as $Ce:CaF_2$) crystals. This metal fluoride eutectic has a layered structure in which the above two crystal phases are phase-separated.

The metal fluoride eutectic can be used preferably as a neutron scintillator, because if emits scintillation light based on the following course upon entry of neutrons. First, when neutrons are incident on LiF, the neutrons are captured by $^6$Li-isotope in the LiF, whereby a capture reaction takes place to generate secondary particles, i.e., α particles and tritium. Then, such secondary particles migrate in the eutectic, reaching $Ce:CaF_2$ and exciting the $Ce:CaF_2$. Finally, the excited $Ce:CaF_2$ emits scintillation light. That is, the LiF and $Ce:CaF_2$ of the metal fluoride eutectic of the present invention act, respectively, as a neutron capturing material and a fluorescent substance emitting scintillation light.

In the above metal fluoride eutectic, the component ratio between lithium fluoride and calcium fluoride (lithium fluoride/calcium fluoride) is not limited. However, the preferred component ratio is 0.75 mol/0.25 mol to 0.85 mol/0.15 mol. Ideally, the component ratio at the eutectic point for lithium fluoride and calcium fluoride, namely, lithium fluoride/calcium fluoride=0.8 mol/0.2 mol, is particularly preferred. If a molar ratio deviating greatly from such a component ratio at the eutectic point is adopted, there is a possibility that the resulting metal fluoride eutectic will be considerably cloudy, or that the brightness of scintillation light will decline.

In the metal fluoride eutectic, it is preferred that the $^6$Li-isotope ratio of LiF be 20 to 99%. By setting the $^6$Li-isotope ratio at 20% or more, preferably 90% or more, the probability for the capture reaction increases to raise the detection efficiency for neutrons. In consideration of the cost involved in isotope enrichment, on the other hand, the $^6$Li-isotope ratio is preferably set at 99% or less.

The metal fluoride eutectic of the present invention is characterized most greatly by containing $Ce:CaF_2$ which functions as the fluorescent substance emitting scintillation light. The brightness of scintillation light from $Ce:CaF_2$ is sufficiently high in the case of excitation with secondary particles generated upon capture of neutrons, but is specifically low in the case of excitation with gamma rays. According to the metal fluoride eutectic of the present invention, therefore, incidence of neutrons and incidence of gamma rays can be easily discriminated based on the brightness of scintillation light, with the result that a neutron scintillator excellent in n/γ discrimination ability can be provided.

With the metal fluoride eutectic of the present invention, the properties such as brightness of scintillation light vary with the content of cerium in the calcium fluoride crystals. This content of cerium can be adjusted by the amount of a cerium material added to a material mixture when the metal fluoride eutectic is to be produced. The cerium content is not limited, but is preferably set at 0.05 to 10 mol % with respect to calcium fluoride. The cerium content of 0.05 mol % or more can enhance the brightness of scintillation light, whereas the cerium content of 10 mol % or less can avoid problems, such as marked cloudiness of the metal fluoride eutectic or attenuation of scintillation light due to concentration quenching. With a high cerium content, a crystal phase of cerium fluoride may form aside from $Ce:CaF_2$ crystals. Basically, however, the cerium fluoride crystal phase does not present an obstacle, as long as the $Ce:CaF_2$ crystals perform the scintillation function by the aforementioned mechanism.

The exact state of existence of cerium atoms is unknown. In the calcium fluoride crystals, however, most of the cerium atoms may be present as substituted by Ca atoms, and some of them may be present within a crystal lattice as well.

In the eutectic, the thickness of the laminar lithium fluoride crystal layer is preferably 0.1 to 5 μm. As described above, secondary particles produced upon capture of neutrons in the LiF crystals migrate through the eutectic, and arrive at the $Ce:CaF_2$ crystals. However, their energy is partly lost during the course of their migration. When the LiF crystal layer is thick, therefore, the energy imparted from the secondary particles generated by the nuclear reaction to $Ce:CaF_2$ varies greatly, thus leading to great variations in the brightness of scintillation light emitted by $Ce:CaF_2$. Investigations by the present inventors have revealed that the thinner the LiF crystal layer, the smaller variations the brightness of scintillation light shows, and that by setting this thickness at 5 μm or less, a neutron scintillator with excellent n/γ discrimination ability can be obtained. Setting the thickness of the LiF crystal layer at less than 0.1 μm is technically difficult, and requires special means. Thus, the lower limit of such a thickness should be 0.1 μm.

Methods for producing the metal fluoride eutectic of the present invention are not limited. Generally, there can be employed a method which comprises mixing powders of the raw materials, i.e., lithium fluoride, calcium fluoride and cerium fluoride, to prepare a material mixture, heating the material mixture to melt it, and then cooling the resulting melt for solidification. However, this method is not necessarily preferred in incorporating a relatively large amount of cerium into calcium fluoride crystals, and may decrease the brightness of scintillation light. This phenomenon is specifically observed when a trivalent lanthanoid such as cerium is added to a metal fluoride eutectic composed of lithium fluoride and calcium fluoride, and the cause of this phenomenon is uncertain.

According to investigations by the present inventors, the following method of production has been found preferred in incorporating a large amount of cerium: the method which comprises: separately preparing a material comprising calcium fluoride crystals containing cerium (hereinafter referred to as a $Ce:CaF_2$ material); mixing the $Ce:CaF_2$ material and lithium fluoride to prepare a material mixture; heating the material mixture to melt it; and then cooling the resulting melt for solidification. According to this production method, a sufficient amount of cerium can be incorporated into calcium fluoride crystals, and thus the brightness of scintillation light can be enhanced sufficiently.

A method for preparing the $Ce:CaF_2$ material is not limited. However, the preferred method comprises mixing a powder of cerium fluoride and a powder of calcium fluoride to prepare a material mixture, heating the material mixture to melt it, and then cooling the resulting melt for solidification. The amount of cerium fluoride added is not limited, but its amount of 0.05 to 10 mol % based on calcium fluoride results in the aforementioned cerium content in the calcium fluoride crystals.

Other investigations by the present inventors have shown the following facts: In the above-mentioned production method comprising melting a material mixture of powders of the respective materials, and solidifying the resulting melt, the addition, as an additive, of at least one alkali metal fluoride selected from NaF, KF, RbF and CsF is preferred particularly when a large amount of cerium is incorporated. Also in directly producing the metal fluoride eutectic from the respective materials, lithium fluoride, calcium fluoride and cerium fluoride, the addition of such an additive enables a sufficient amount of cerium to be incorporated in calcium fluoride crystals. Compared with the above method using the $Ce:CaF_2$ material, moreover, such a direct production method can simplify the manufacturing process, and can thus reduce the manufacturing cost markedly.

As the alkali metal fluoride, sodium fluoride or potassium fluoride is preferred. The amount of the alkali metal fluoride added is not limited, but is preferably 10 to 1000 mol % based on cerium fluoride, and 0.05 to 10 mol % based on calcium fluoride. By setting the amount of the alkali metal fluoride added at 10 mol % or more based on cerium fluoride and 0.05 mol % or more based on calcium fluoride, cerium can be contained efficiently in the calcium fluoride crystals. An extreme increase in its amount added, on the other hand, may separately form a crystal phase of the alkali metal fluoride, thereby causing marked cloudiness of the resulting metal fluoride eutectic. Thus, the amount of the alkali metal fluoride added is preferably 1000 mol % or less based on cerium fluoride, and 10 mol % or less based on calcium fluoride.

The method for producing the metal fluoride eutectic of the present invention will now be described.

First, powders of the materials, lithium fluoride, calcium fluoride and cerium fluoride, are mixed to prepare a material mixture. When the manufacturing method using the $Ce:CaF_2$ material is adopted, however, lithium fluoride and the $Ce:CaF_2$ material are mixed to prepare a material mixture. Also, the aforementioned alkali metal fluoride may be added as an additive to the material mixture.

In the present invention, the purities of the materials, lithium fluoride, calcium, fluoride and cerium fluoride, and the alkali metal fluoride as the additive are not limited, but are preferably 99.99% or higher. By using such high purity materials and additive, the properties such as the brightness of scintillation light are improved. The materials and the additive may be used in powdery or particulate form, or may be sintered or melt-solidified beforehand and then used.

The material mixture is charged into a crucible, and heated to be melted. Then, a melt of the material mixture melted is cooled to be solidified. During the solidification, phase separation between an LiF phase and a $Ce:CaF_2$ phase takes place, and a metal fluoride eutectic is formed simultaneously with the solidification. In order to control a layered structure (thickness, continuity, linearity), in particular, the unidirectional solidification process for solidifying the melt in one particular direction can be used preferably.

The unidirectional solidification process will be illustrated by FIG. 1 taken as an example. A melt is placed inside a furnace body adjusted to a high temperature in its upper portion and a low temperature in its lower portion. When either the melt is lowered, or the furnace body is raised, the melt is cooled from its lower part, and a part of the melt below the solidification point solidifies to become a metal fluoride eutectic. At this time, a solid-liquid interface is formed between the metal fluoride eutectic and the melt. When the melt is further lowered, or the furnace body is further raised, the solid-liquid interface moves upward and the metal fluoride eutectic extends. By performing such a procedure continuously, the melt can be solidified in one specific direction. In the present invention, the direction in which the melt is solidified in one specific direction is referred to as a solidification direction, and a rate at which solidification is allowed to proceed is referred to as a solidification rate.

According to the above-mentioned unidirectional solidification process, the thickness of the LiF crystal layer in the metal fluoride eutectic can be easily decreased by increasing the solidification rate, and a metal fluoride eutectic having a thickness of the LiF crystal layer of 5 µm or less can be produced efficiently. By means of the unidirectional solidification process, moreover, $Ce:CaF_2$ crystals as well as LiF crystals extend along the solidification direction as shown in FIG. 1. As a result, a metal fluoride eutectic having the LiF crystals linearly continuous in one direction and also the $Ce:CaF_2$ crystals linearly continuous in the one direction can be produced.

Figure 2:
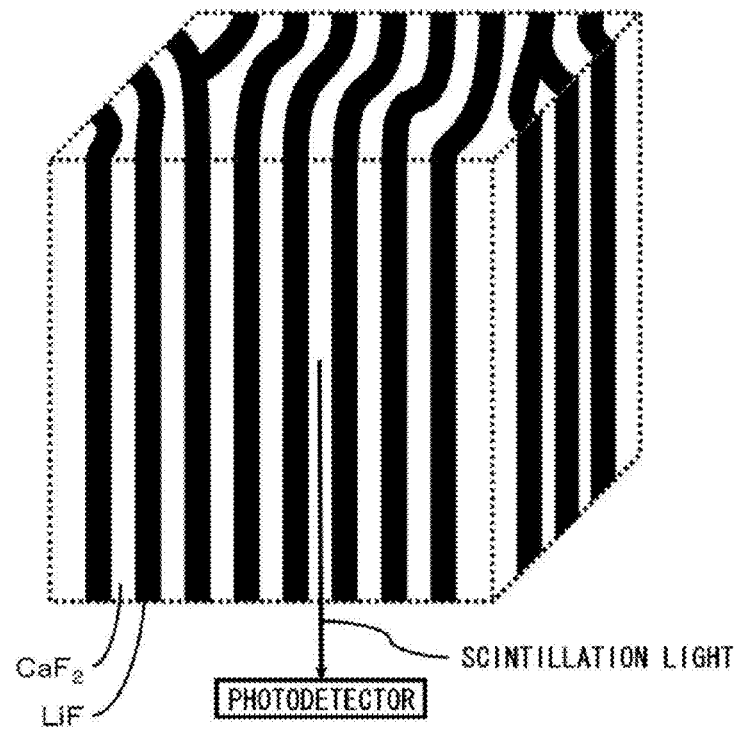
FIG. 2 is a schematic view showing the layered structure of a neutron scintillator according to the present invention.

The metal fluoride eutectic having the $Ce:CaF_2$ crystals linearly continuous in one direction as above exhibits special effects when combined with a photodetector to construct a neutron detector. That is, in a eutectic composed of LiF crystals and $Ce:CaF_2$ crystals, the $Ce:CaF_2$ crystals generally fail to be linearly continuous in one direction. When scintillation light is emitted from $Ce:CaF_2$, therefore, the scintillation light is scattered at the interface between the $Ce:CaF_2$ crystals and the LiF crystals. As a result, the propagation efficiency of scintillation light toward the photodetector decreases. In a neutron scintillator using a metal fluoride eutectic in which $Ce:CaF_2$ crystals are linearly continuous in one direction, by contrast, the propagation efficiency of scintillation light is high in the direction of linear continuity of the $Ce:CaF_2$ crystals (the direction indicated by an arrow in FIG. 2). Thus, a photodetector is placed at an end in the direction of the continuous crystals, whereby the detection efficiency of scintillation light in the photodetector can be increased.

The thickness of the Ce:CaF$_2$ crystal layer is not limited, because it does not affect the propagation efficiency of scintillation light. However, the thickness is, for example, 0.1 to 10 μm.

Concrete methods illustrating the unidirectional solidification process are: the Bridgman method in which a crucible charged with a melt is placed within a furnace body adjusted to a high temperature in an upper portion thereof and a low temperature in a lower portion thereof, and the crucible is lowered to solidify the melt in one direction from bottom to top; the gradient freeze method in which a crucible charged with a melt is placed within a furnace body adjusted to a high temperature in an upper portion thereof and a low temperature in a lower portion thereof, and cooling is performed, with a temperature distribution being kept to hold the lower portion always at a low temperature, whereby the melt is solidified in one direction from bottom to top; the Czochralski method in which with a solid-liquid interface being held at a constant position, a metal fluoride eutectic is pulled up while being solidified in one direction; and the micro-pulling-down method in which with a solid-liquid interface being held at a constant position, a metal fluoride eutectic is pulled down while being solidified in one direction.

The production method adopting the unidirectional solidification process will be described in detail, with the Bridgman method taken as an example.

First, powders of lithium fluoride, calcium fluoride and cerium fluoride as starting materials are mixed to prepare a material mixture. If the aforementioned alkali metal fluoride is added, however, the material mixture having the alkali metal fluoride added thereto is used as the starting material. If the method of preparing the Ce:CaF$_2$ material separately beforehand is adopted, a powder or the like of lithium fluoride and the Ce:CaF$_2$ material are mixed to prepare a material mixture.

Then, the material mixture is charged into a crucible, and the charged crucible is set in a chamber equipped with a heater, a heat insulator, and a vacuum evacuator. Using the vacuum evacuator, the interior of the chamber is evacuated to $1.0 \times 10^{-3}$ Pa or lower. Then, an inert gas such as high purity argon is introduced into the chamber for a gas exchange operation. The pressure within the chamber after the gas exchange operation is not limited, but is generally atmospheric pressure. By this gas exchange operation, water adhering to the starting materials or the interior of the chamber can be removed. Consequently, problems such as attenuation of scintillation light of the metal fluoride eutectic, which is ascribed to such water, can be avoided.

To avoid adverse influence due to water which cannot be removed even by the above gas exchange operation, it is preferred to remove water with the use of a scavenger highly reactive with water. As such a scavenger, a gaseous scavenger such as tetrafluoromethane can be used preferably. When the gaseous scavenger is used, the preferred method is to mix it with the above-mentioned inert gas and introduce the mixture into the chamber.

After the gas exchange operation is performed, the material mixture is heated by the heater until it is melted. The temperature when melting the material mixture differs according to the chemical composition of the material mixture, but is generally in the range of 770° C. to 900° C. which is the eutectic point of lithium fluoride and calcium fluoride. The method of heating by the heater is not limited, and a high frequency induction heating method or a resistance heating method, for example, can be used as appropriate.

Then, a melt of the molten material mixture is lowered together with the crucible. Since the heater and the heat insulator are arranged so as to be at a high temperature in their upper parts and at a low temperature in their lower parts, the melt solidifies, beginning in its lower portion, as it descends. During such solidification, phase separation between LiF crystals and Ce:CaF$_2$ crystals occurs, and a metal fluoride eutectic forms simultaneously with solidification. By further lowering the melt continuously, the melt solidifies unidirectionally from bottom to top, and the metal fluoride eutectic extends along the solidification direction. Thus, a metal fluoride eutectic having Ce:CaF$_2$ crystal layers linearly continuous in one direction can be produced.

In the above-described Bridgman method, the rate at which to lower the melt, namely, the solidification rate, is not limited, but is preferably 2 to 50 mm/hr. The faster the solidification rate, the thinner the LiF crystal layer becomes. By setting the solidification rate at 2 mm/hr or higher, a metal fluoride eutectic with the LiF crystal layer thickness of 5 μm or less can be produced. If the solidification rate exceeds 50 mm/hr, on the other hand, cloudiness or cracking of the metal fluoride eutectic may be noticeable. Thus, the solidification rate is preferably set at 50 mm/hr or lower.

A temperature change per unit distance along the solidification direction, namely, a temperature gradient, is not limited, but is preferably 0.5° C./mm or more. By setting the temperature gradient at 0.5° C./mm or more, the unidirectionality of the Ce:CaF$_2$ crystal layers can be enhanced. The upper limit of the temperature gradient is not limited, but is generally 10° C./mm or less.

The layered structure of the resulting metal fluoride eutectic can be identified by observing a compositional backscattered electron image with the use of a scanning electron microscope (SEM). That is, in the compositional backscattered electron image, the LiF crystal and the CaF$_2$ crystal exhibit a distinct contrast to each other based on the difference between their atomic numbers, so that an image reflecting the layered structure as shown in FIG. 1 can be easily obtained.

The identification of the crystal phases constituting the metal fluoride eutectic can be made by powder X-ray diffraction measurement. That is, by making the powder X-ray diffraction measurement of a powder formed by pulverizing the metal fluoride eutectic and analyzing a diffraction pattern obtained, the metal fluoride eutectic is identified as a metal fluoride eutectic composed of LiF crystals and CaF$_2$ crystals.

The metal fluoride eutectic of the present invention has satisfactory processability, and is easily used as processed into a desired shape. In processing the metal fluoride eutectic, a cutter such as a blade saw or a wire saw, a grinder or an abrasive wheel, which is publicly known, can be used without limitation.

The metal fluoride eutectic of the present invention can be processed into a desired shape to form a neutron scintillator according to the present invention. The shape of the neutron scintillator may be any shape, including the shape of a plate, a block, or an array of a plurality of quadrangular prism-shaped metal fluoride eutectics arranged. Moreover, the neutron scintillator comprising the metal fluoride eutectic of the present invention is combined with a photo-detector such as a photomultiplier tube, whereby a neutron detector can be constituted. With this neutron detector, scintillation light emitted from the neutron scintillator upon irradiation with neutrons is converted into an electrical signal by the photomultiplier tube, whereby the presence or absence and strength of neutrons can be grasped as the electrical signal. Scintillation light emitted by the neutron scintillator of the present invention is light with a wavelength of about 300 to 350 nm, and the photomultiplier tube capable of detecting light in this region can be used particularly preferably. Specific examples of such a photomultiplier tube are R7600U and H7416 produced by Hamamatsu Photonics K.K.

Concretely, there can be named, for example, a method which comprises coupling the neutron scintillator of the present invention to the photoelectric surface of the photomultiplier tube with the use of an optical grease or the like, applying a high voltage to the photomultiplier tube, and measuring an electrical signal outputted by the photomultiplier tube. In order to analyze the strength of a neutron beam or the like by utilizing the electrical signal from the photomultiplier tube, an amplifier, a multi-channel analyzer or the like may be provided at a stage subsequent to the photomultiplier tube. Furthermore, the neutron scintillator composed of the metal fluoride eutectic according to the present invention can be combined with a position-sensitive photodetector to construct a neutron imaging device. As the position-sensitive photodetector, a position-sensitive photomultiplier tube can be preferably used. Its examples include XP85012 produced by PHOTONIS USA INC.

EXAMPLES

Hereinbelow, the present invention will be described specifically by reference to its Examples, but the present invention is in no way limited by these Examples. Moreover, not all of combinations of the features described in the Examples are essential to the means for solution to problems that the present invention adopts.

Example 1

Preparation of Ce:$CaF_2$ Material

First, 2.3 g of cerium fluoride was added to 180 g of calcium fluoride, i.e., cerium was added in a proportion of 0.5 mol % with respect to calcium fluoride, followed by thorough mixing, and charging the mixture into a crucible. The calcium fluoride and the cerium fluoride used were powders with purities of 99.99% or higher.

Then, the crucible charged with the calcium fluoride and cerium fluoride was set in a chamber equipped with a vacuum evacuator and a heater. Using the vacuum evacuator, the interior of the chamber was evacuated to $5.0 \times 10^{-4}$ Pa or lower. Then, a mixed gas consisting of 5 vol. % tetrafluoromethane and 95 vol. % high purity argon was introduced into the chamber for a gas exchange operation.

After the gas exchange operation, the above calcium fluoride and cerium fluoride were heated to 1500° C. using a resistance heating type carbon heater until they were melted. Then, the melt was cooled and solidified to obtain a Ce:$CaF_2$ material.

Production of Metal Fluoride Eutectic

First, 180 g of the above Ce:$CaF_2$ material was chipped, and 230 g of lithium fluoride was added, whereafter these materials were thoroughly mixed to prepare a material mixture. As the lithium fluoride, a powder having a $^6$Li-isotope ratio of 95% and purity of 99.99% or more was used. The mixing ratio between lithium fluoride and calcium fluoride in the material mixture was 0.8 lithium fluoride/0.2 calcium fluoride (mol/mol), and the amount of cerium added was 0.5 mol % with respect to calcium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to $2.0 \times 10^{-4}$ Pa or lower. Then, a high purity argon gas mixed with 5 vol. % tetrafluoromethane was introduced into the chamber for a gas exchange operation. The pressure within the chamber after the gas exchange operation was atmospheric pressure.

After the gas exchange operation was performed, the material mixture was heated by the heater until it was melted.

The heater and the heat insulator were arranged such that a temperature gradient in the solidification direction was 2.5° C./mm, and the output of the heater was adjusted such that the temperature at the bottom of the crucible was 830° C.

Then, the melt of the material mixture melted was continuously lowered together with the crucible to solidify the melt unidirectionally from bottom to top. In the present Example, the rate at which the melt was lowered, namely, the solidification rate, was set at 10 mm/hr. By this procedure, the melt was totally solidified to obtain a metal fluoride eutectic used in the present invention.

Figure 3:
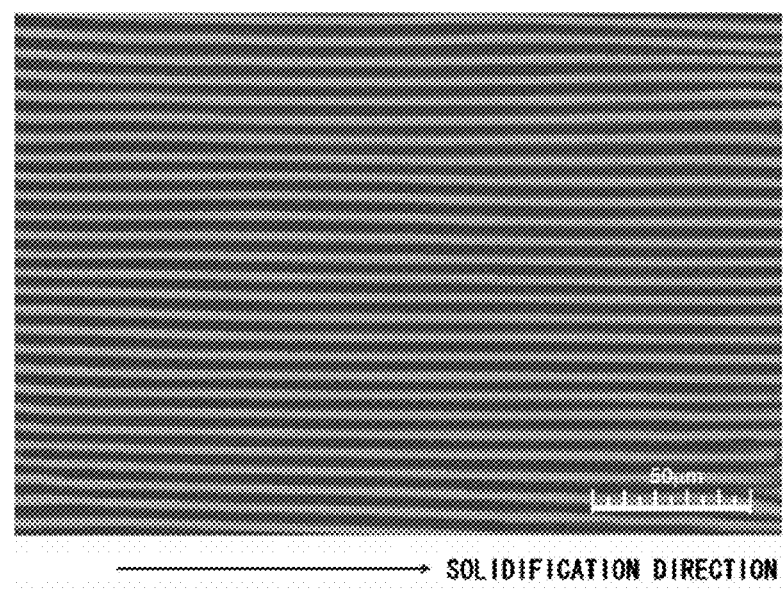
FIG. 3 is a compositional backscattered electron image of a cut surface of a metal fluoride eutectic obtained in Example 1 when the metal fluoride eutectic was cut in a direction parallel to a solidification direction.
Figure 4:
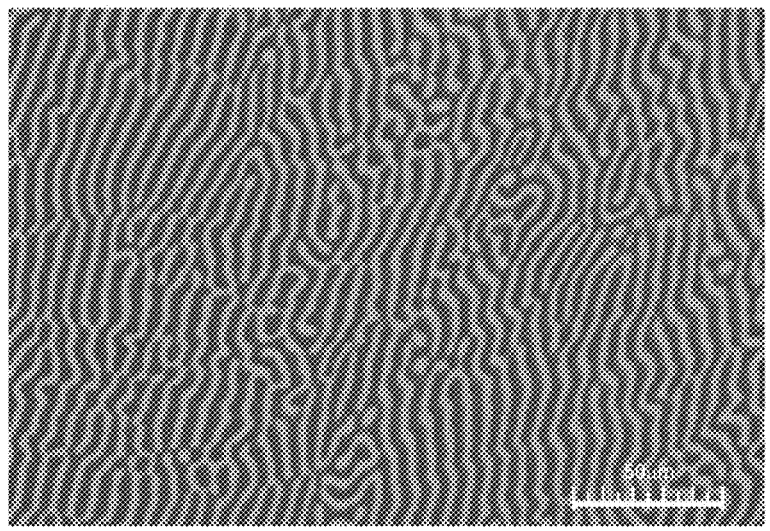
FIG. 4 is a compositional backscattered electron image of a cut surface of the metal fluoride eutectic obtained in Example 1 when the metal fluoride eutectic was cut in a direction perpendicular to the solidification direction.

The resulting metal fluoride eutectic was cut in a direction parallel to the solidification direction end in a direction perpendicular to the solidification direction by a wire saw provided with a diamond wire, and the cut surface was mirror polished, a compositional backscattered electron image of the surface when cut in the direction parallel to the solidification direction is shown in FIG. 3. A compositional backscattered electron image of the surface when cut in the direction perpendicular to the solidification direction is shown in FIG. 4. Highlights of the compositional backscattered electron images represent $CaF_2$ crystal layers, while shadows of the compositional backscattered electron images represent LiF crystal layers.

FIG. 3 shows that the $CaF_2$ crystal layers were linearly continuous in one direction. In connection with the compositional backscattered electron image of FIG. 4, the thickness of the LiF crystal layer was measured using the length measuring function of the SEM. The thickness of the layer of LiF in the metal fluoride eutectic was found to be 3 µ. In measuring the thickness of the LiF crystal layer, calibration was performed using a standard grid with a spacing length of 23 µm to carry out the measurement.

Figure 5:
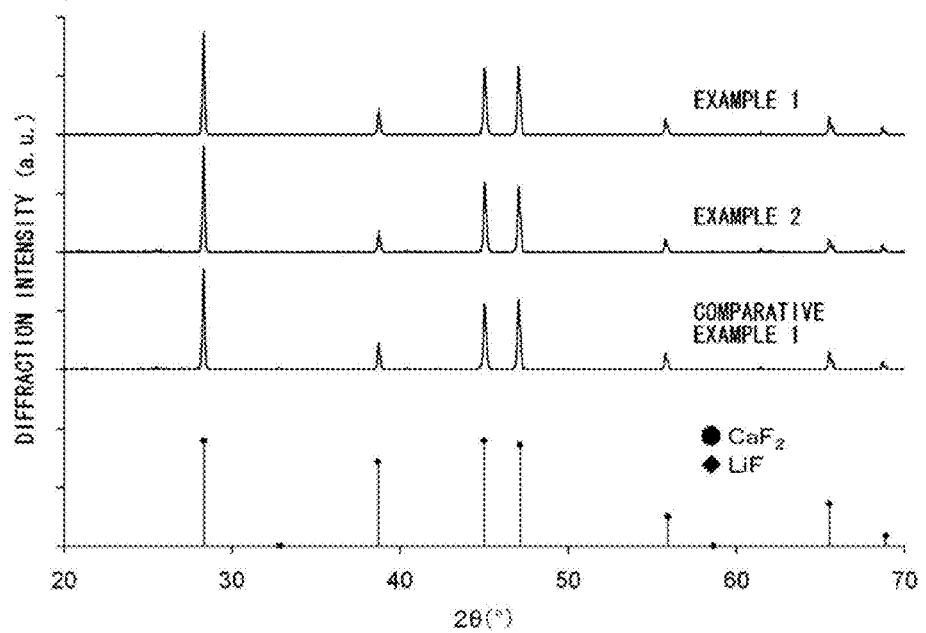
FIG. 5 shows the powder X-ray diffraction patterns of the metal fluoride eutectic and those obtained in Example 1, Example 2 and Comparative Example 1.

The resulting metal fluoride eutectic was pulverized to form a powder, which was subjected to powder X-ray diffraction measurement, whereby the crystal phases were identified. "D8 DISCOVER" produced by Bruker AXS K.K was used as a measuring device. A diffraction pattern obtained is shown in FIG. 5. From FIG. 5, diffraction peaks attributed to LiF crystals and $CaF_2$ crystals were confirmed, showing that the metal fluoride eutectic was a metal fluoride eutectic composed of LiF crystals and $CaF_2$ crystals.

Preparation and Characteristics Evaluation of Neutron Scintillator

The resulting metal fluoride eutectic was cut by a wire saw provided with a diamond wire, and was then ground and mirror polished to be processed into a shape 7 mm in length, 2 mm in width, and 1 mm in thickness. In this manner, a neutron scintillator according to the present invention was obtained. The characteristics of the neutron scintillator in response to neutrons were evaluated by the following method:

The surface of the neutron scintillator, measuring 7 mm in length and 2 mm in width, was coupled to the photoelectric surface of the photomultiplier tube (R7600U produced by Hamamatsu Photonics K.K.) with the use of an optical grease to produce a neutron detector.

The neutron detector was covered with a light shielding material made of a black vinyl sheet so that external light would not enter the photoelectric surface of the photomultiplier tube. Then, the neutron scintillator was irradiated with neutrons from $^{252}$Cf with radioactivity of 1 MBq, the neutrons being slowed down via a neutron moderator comprising a polyethylene block having a thickness of 40 mm. To measure scintillation light emitted from the neutron scintillator, a high voltage of 800V was applied from a power supply line to the photomultiplier tube, whereby scintillation light was converted into an electrical signal, which was outputted from a signal output line. The electrical signal outputted from the photomultiplier tube is a pulsed signal reflecting the scintillation light, and the pulse height of the pulsed signal represents the brightness of scintillation light. Such electrical signals outputted from the photomultiplier tube were shaped and amplified by a shaping amplifier, and then entered into a multichannel pulse height analyzer to analyze them and prepare a pulse height spectrum.

Figure 6:
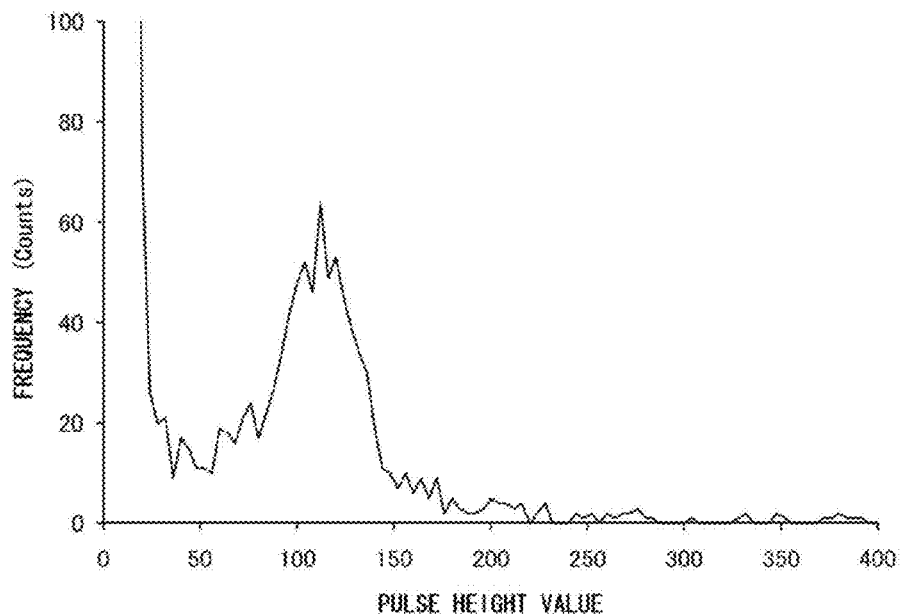
FIG. 6 shows the pulse height spectrum of a neutron scintillator of Example 1 when irradiated with neutrons.

The resulting pulse height spectrum is shown in FIG. 6. The abscissa of the pulse height spectrum represents the pulse height value of the electrical signal, namely, the brightness of the scintillation light, indicating here the value of the pulse height channel of the multichannel pulse height analyzer. The ordinate represents the frequency of the electrical signal showing each pulse height value. The frequency was expressed as the number of times (counts) the electrical signal concerned was measured.

Clear peaks indicating the detection of neutrons were confirmed from FIG. 6. This finding has proved that the metal fluoride eutectic of the present invention acts effectively as a neutron scintillator, and that the neutron detector using the neutron scintillator is effective.

To evaluate the n/γ discrimination ability of the neutron scintillator, scintillation light emitted upon excitation with alpha rays and scintillation light emitted upon excitation with gamma rays were measured and compared with each other by the following methods:

In the case of excitation with alpha rays, $^{241}$Am having radioactivity of 4 MBq was placed in proximity to the neutron scintillator of the neutron detector, and the neutron detector was shielded from light with a light shielding sheet so that external light would not enter under irradiation with alpha rays. In the case of excitation with gamma rays, after shielding from light with a light shielding sheet so that external light would not enter, $^{137}$Cs having radioactivity of 1 kBq was placed at a position about 30 mm apart from the neutron scintillator, and the neutron scintillator was irradiated with gamma rays.

To measure scintillation light emitted when the neutron scintillator was excited with each of alpha rays and gamma rays, the scintillation light was converted into an electrical signal via a photomultiplier tube to which a high voltage of 800V was applied. Such electrical signals outputted from the photomultiplier tube were shaped and amplified by a shaping amplifier, and then entered into a multichannel pulse height analyzer to analyze them and prepare a pulse height spectrum.

Figure 7:
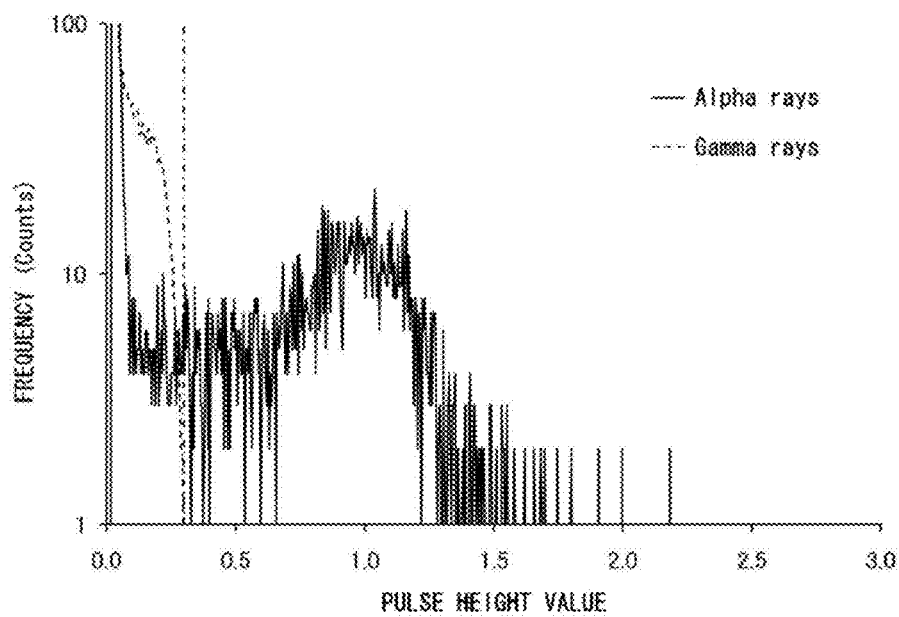
FIG. 7 shows the pulse height spectra of the neutron scintillator of Example 1 when irradiated with alpha rays and gamma rays.

The resulting pulse height spectra are shown in FIG. 7. Solid lines and dotted lines, respectively, represent the pulse height spectra obtained by excitation with alpha rays and gamma rays. The abscissa represents the pulse height value expressed as a relative value with respect to the peak value of the pulse height spectrum, which is obtained upon excitation with alpha rays, defined as 1.

In the resulting pulse height spectrum, the pulse height value obtained when the neutron scintillator was excited with gamma rays was 0.3 at the maximum, a value sufficiently low as compared with the peaks of the pulse height values in the case of alpha ray excitation. It is seen, therefore, that gamma-ray noises can be easily eliminated, for example, by taking the pulse height value indicated by the chain line of FIG. 7 as a threshold value, removing electrical signals of pulse height values below this threshold value, and selecting only electrical signals of pulse height values exceeding the threshold value. That is, the neutron scintillator of the present invention has been found to have excellent n/γ discrimination ability.

Example 2

Production of Metal Fluoride Eutectic

First, 180 g of calcium fluoride, 230 g of lithium fluoride, 2.3 g of cerium fluoride, end 1.4 g of sodium fluoride as an additive were weighed, and thoroughly mixed to prepare a material mixture. The respective materials and the additive sodium fluoride used were powders with purities of 99.99% or higher, and the $^6$Li-isotope ratio of the lithium fluoride was 95%.

In the material mixture, the mixing ratio between lithium fluoride and calcium fluoride was 0.8 lithium fluoride/0.2 calcium fluoride (mol/mol), and the amount of cerium added was 0.5 mol % with respect to calcium fluoride. The amount of the additive sodium fluoride added was 300 mol % with respect to cerium fluoride and 1.5 mol % with respect to calcium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to $2.0 \times 10^{-4}$ Pa or lower. Then, a high purity argon gas mixed with 5 vol. % tetrafluoromethane was introduced into the chamber for a gas exchange operation. The pressure within the chamber after the gas exchange operation was atmospheric pressure.

After the gas exchange operation was performed, the material mixture was heated by the heater until it was melted.

The heater and the heat insulator were arranged such that a temperature gradient in the solidification direction was 2.5° C./mm, and the output of the heater was adjusted such that the temperature at the bottom of the crucible was 830° C.

Then, the melt of the material mixture melted was continuously lowered together with the crucible to solidify the melt unidirectionally from bottom to top. In the present Example, the rate at which the melt was lowered, namely, the solidification rate, was set at 10 mm/hr. By this procedure, all of the melt was solidified to obtain a metal fluoride eutectic used in the present invention.

The resulting metal fluoride eutectic was processed in the same manner as in Example 1, and its compositional backscattered electron image was observed. In the metal fluoride eutectic of the present Example, it was found that the $CaF_2$ crystal layers were linearly continuous in one direction, and the thickness of the layer of LiF was 3 μm.

A powder of the resulting metal fluoride eutectic pulverized was subjected to powder X-ray diffraction measurement in the same manner as in Example 1, whereby the crystal phases were identified. A diffraction pattern obtained is shown in FIG. 5. From FIG. 5, diffraction peaks attributed to LiF crystals and $CaF_2$ crystals were confirmed, showing that the metal fluoride eutectic was a metal fluoride eutectic composed of LiF crystals and $CaF_2$ crystals.

Preparation and Characteristics Evaluation of Neutron Scintillator

The resulting metal fluoride eutectic was processed in the same manner as in Example 1 to obtain a neutron scintillator according to the present invention. The characteristics of the neutron scintillator in response to neutrons were evaluated in the same manner as in Example 1. A pulse height spectrum obtained is shown in FIG. 8.

Figure 8:
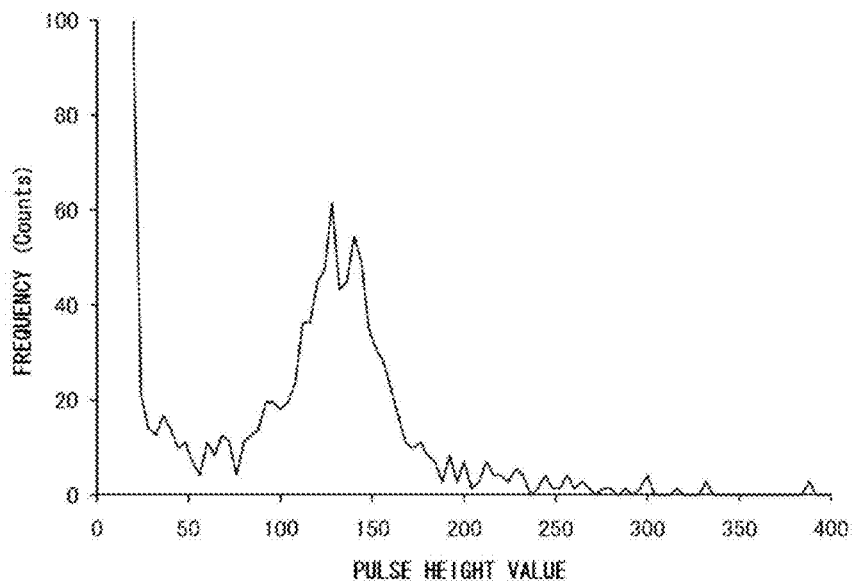
FIG. 8 shows the pulse height spectrum of a neutron scintillator of Example 2 when irradiated with neutrons.

Clear peaks indicating the detection of neutrons were confirmed from FIG. 8. This finding has proved that the metal fluoride eutectic of the present invention acts effectively as a neutron scintillator, and that a neutron detector using the neutron scintillator is effective.

Figure 9:
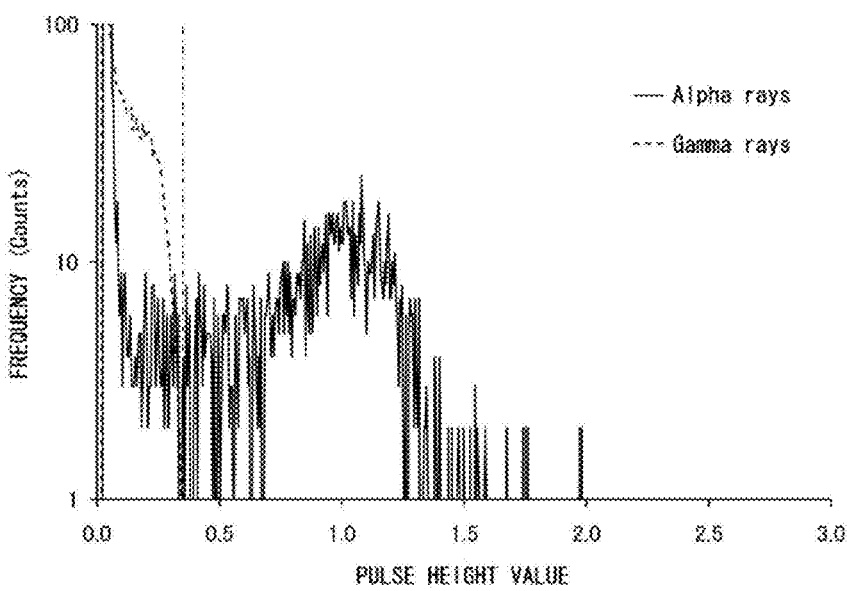
FIG. 9 shows the pulse height spectra of the neutron scintillator of Example 2 when irradiated with alpha rays and gamma rays.

To evaluate the n/γ discrimination ability of the neutron scintillator, scintillation light emitted upon excitation with alpha rays and scintillation light emitted upon excitation with gamma rays were measured and compared in the same manner as in Example 1. Pulse height spectra obtained are shown in FIG. 9. In the resulting pulse height spectra, the pulse height value obtained by excitation with gamma rays was 0.35 at the maximum, which was sufficiently low as compared with the peaks of the pulse height values obtained upon alpha ray excitation. Thus, the neutron scintillator of the present invention has been found to have excellent n/γ discrimination ability.

Comparative Example 1

Production of Metal Fluoride Eutectic

In the present comparative example, a metal fluoride eutectic composed of lithium fluoride crystals and europium-containing calcium fluoride crystals was produced.

First, 180 g of calcium fluoride, 230 g of lithium fluoride, and 2.4 g of europium fluoride were weighed, and thoroughly mixed to prepare a material mixture. The respective materials used were powders with purities of 99.99% or higher, and the $^6$Li-isotope ratio of the lithium fluoride was 95%.

In the material mixture, the mixing ratio between lithium fluoride and calcium fluoride was 0.8 lithium fluoride/0.2 calcium fluoride (mol/mol), and the amount of europium added was 0.5 mol % with respect to calcium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to $2.0 \times 10^{-4}$ Pa or lower. Then, a high purity argon gas mixed with 5 vol. % tetrafluoromethane was introduced into the chamber for a gas exchange operation. The pressure within the chamber after the gas exchange operation was atmospheric pressure.

After the gas exchange operation was performed, the material mixture was heated by the heater until it was melted.

The heater and the heat insulator were arranged such that a temperature gradient in the solidification direction was 2.5° C./mm, and the output of the heater was adjusted such that the temperature at the bottom of the crucible was 830° C.

Then, the melt of the material mixture melted was continuously lowered together with the crucible to solidify the melt unidirectionally from bottom to top. In the present Example, the rate at which the melt was lowered, namely, the solidification rate, was set at 10 mm/hr. By this procedure, all of the melt was solidified to obtain a metal fluoride eutectic.

The resulting metal fluoride eutectic was processed in the same manner as in Example 1, and its compositional backscattered electron image was observed. In the eutectic of the present Comparative Example, it was found that the $CaF_2$ crystal layers were linearly continuous in one direction, and the thickness of the layer of LiF was 3 μm.

A powder of the resulting metal fluoride eutectic pulverized was subjected to powder X-ray diffraction measurement in the same manner as in Example 1, whereby the crystal phases were identified. A diffraction pattern obtained is shown in FIG. 5. From FIG. 5, diffraction peaks attributed to LiF crystals and $CaF_2$ crystals were confirmed, showing that the metal fluoride eutectic was a metal fluoride eutectic composed of LiF crystals and $CaF_2$ crystals.

Preparation and Characteristics Evaluation of Neutron Scintillator

The resulting metal fluoride eutectic was processed in the same manner as in Example 1 to obtain a neutron scintillator. The characteristics of the neutron scintillator in response to neutrons were evaluated in the same manner as in Example 1. A pulse height spectrum obtained is shown in FIG. 10.

Figure 10:
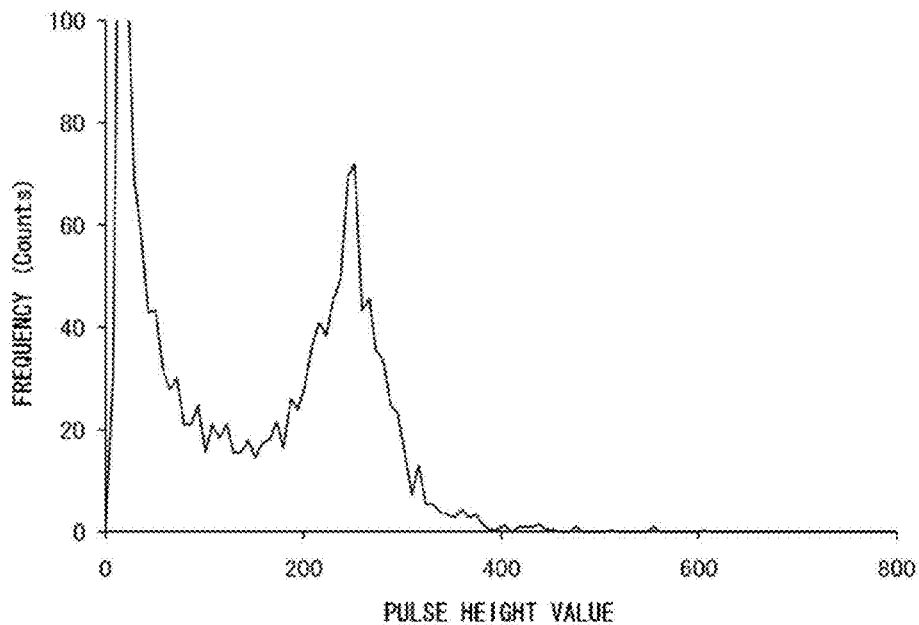
FIG. 10 shows the pulse height spectrum of a neutron scintillator of Comparative Example 1 when irradiated with neutrons.

Clear peaks indicating the detection of neutrons were confirmed from FIG. 10. This finding has proved that the metal fluoride eutectic of the present Comparative Example acts as a neutron scintillator. To evaluate the n/γ discrimination ability of the neutron scintillator, scintillation light emitted upon excitation with alpha rays and scintillation light emitted upon excitation with gamma rays were measured and compared in the same manner as in Example 1.

Figure 11:
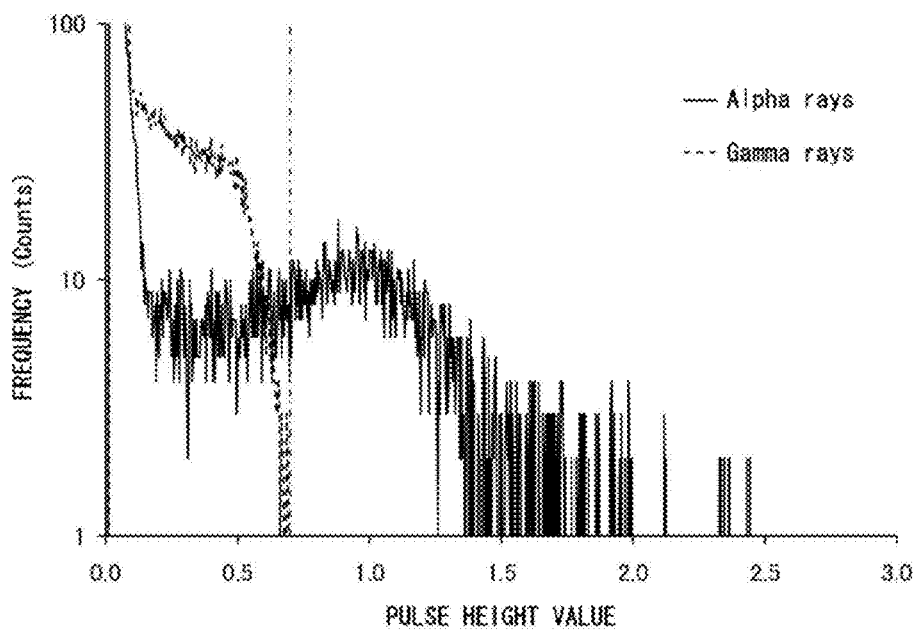
FIG. 11 shows the pulse height spectra of the neutron scintillator of Comparative Example 1 when irradiated with alpha rays and gamma rays.

Pulse height spectra obtained are shown in FIG. 11. In the resulting pulse height spectra, the pulse height value obtained when excited with gamma rays reached 0.7 at the maximum. Thus, the metal fluoride eutectic composed of lithium fluoride crystals and europium-containing calcium fluoride crystals has been found to be poor in n/γ discrimination ability when applied as a neutron scintillator. A comparison between the neutron scintillator of the present Comparative Example and the neutron scintillators of the present invention shown in Examples 1 and 2 has revealed that the neutron scintillator comprising the metal fluoride eutectic according to the present invention has particularly excellent n/γ discrimination ability in comparison with the neutron scintillators comprising metal fluoride eutectics which have been known publicly.

The invention claimed is:

1. A metal fluoride eutectic comprising a lithium fluoride crystal phase and a calcium fluoride crystal phase containing cerium.

2. The metal fluoride eutectic according to claim 1, wherein both of the crystal phases form a layered structure, and a thickness of each of layers of the lithium fluoride crystal phase is 0.1 μm to 5 μm.

3. The metal fluoride eutectic according to claim 1, wherein the calcium fluoride crystal phase is linearly continuous in one direction.

4. The metal fluoride eutectic according to claim 1, wherein a content of cerium is 0.05 to 10 mol % based on calcium fluoride.

5. A neutron scintillator comprising the metal fluoride eutectic according to claim 1.

* * * * *